(12) United States Patent
Chen et al.

(10) Patent No.: US 10,679,974 B2
(45) Date of Patent: Jun. 9, 2020

(54) DISPLAY DEVICE HAVING MULTIPLE PIXELS IN A SUBSTRATE GROOVE

(71) Applicant: Lextar Electronics Corporation, Hsinchu (TW)

(72) Inventors: Fu-Hsin Chen, Hsinchu County (TW); Yu-Chun Lee, Hsinchu County (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/198,790

(22) Filed: Nov. 22, 2018

(65) Prior Publication Data
US 2020/0126955 A1  Apr. 23, 2020

(30) Foreign Application Priority Data
Oct. 22, 2018  (TW) .............................. 107214291 U

(51) Int. Cl.
| | | |
|---|---|---|
| H01L 25/07 | (2006.01) | |
| H01L 33/50 | (2010.01) | |
| H01L 33/58 | (2010.01) | |
| H01L 33/60 | (2010.01) | |
| G02F 1/133 | (2006.01) | |
| H01L 25/075 | (2006.01) | |
| G02F 1/1333 | (2006.01) | |

(52) U.S. Cl.
CPC ........ *H01L 25/0753* (2013.01); *H01L 33/504* (2013.01); *H01L 33/58* (2013.01); *H01L 33/60* (2013.01); *G02F 1/13336* (2013.01)

(58) Field of Classification Search
CPC ... H01L 25/0753; H01L 33/504; H01L 33/58; H01L 33/60; G02F 1/13336
See application file for complete search history.

(56) References Cited

U.S. PATENT DOCUMENTS 5,499,122 A * 3/1996 Yano .................... G02F 1/13334
349/143
6,600,261 B1 * 7/2003 Kitagawa ................. H01J 11/10
313/110
(Continued)

FOREIGN PATENT DOCUMENTS

| CN | 107390430 A | 11/2017 |
|---|---|---|
| TW | I588984 B | 6/2017 |

*Primary Examiner* — Ida M Soward
(74) *Attorney, Agent, or Firm* — CKC & Partners Co., LLC

(57) ABSTRACT

A display device includes a driving substrate, multiple light-emitting elements, first and second transparent substrates, multiple pixels, and a patterned light-absorbing layer. The light-emitting elements are disposed on the driving substrate and used to emit a light. The first transparent substrate is disposed over the driving substrate and the light-emitting elements and includes at least one groove. The pixels are disposed in the groove and include a first sub-pixel, a second sub-pixel, and a third sub-pixel respectively aligned with one of the light-emitting elements. The second transparent substrate covers the first transparent substrate and the pixels. The patterned light-absorbing layer is disposed on the second transparent substrate and includes multiple first openings respectively aligned with the first, second, and third sub-pixels. The first, second, and third sub-pixels correspond to the light emitted by the light-emitting elements to respectively emit a red light, a green light, and a blue light.

17 Claims, 11 Drawing Sheets

(56) References Cited

U.S. PATENT DOCUMENTS

| | | | | |
|---|---|---|---|---|
| 6,630,968 | B1* | 10/2003 | Tsuchihashi | G02F 1/133536 349/113 |
| 6,661,485 | B2* | 12/2003 | Moon | G02F 1/133514 349/106 |
| 6,847,424 | B2* | 1/2005 | Gotoh | G02F 1/133615 349/113 |
| 7,561,231 | B2* | 7/2009 | Kanbe | G02F 1/133536 349/113 |
| 7,618,179 | B2* | 11/2009 | Miyashita | G02B 3/0056 362/307 |
| 9,372,337 | B2* | 6/2016 | Arakawa | G02B 26/001 |
| 9,651,770 | B2* | 5/2017 | Shinto | G02B 1/11 |
| 9,753,199 | B2* | 9/2017 | Nishimura | G02B 5/28 |
| 2002/0013011 | A1* | 1/2002 | Yamanaka | H01L 27/1203 438/30 |
| 2004/0092196 | A1* | 5/2004 | Van De Witte | C09K 19/586 445/24 |
| 2004/0130265 | A1* | 7/2004 | Terao | H01J 9/02 313/582 |
| 2004/0160555 | A1* | 8/2004 | Nemoto | G02F 1/133553 349/113 |
| 2004/0246407 | A1* | 12/2004 | Tanaka | G02F 1/133536 349/96 |
| 2005/0140859 | A1* | 6/2005 | Hashimoto | G02F 1/133512 349/110 |
| 2006/0017860 | A1* | 1/2006 | Adachi | G02B 3/0012 349/1 |
| 2006/0033865 | A1* | 2/2006 | Tanaka | G02F 1/13471 349/113 |
| 2006/0164577 | A1* | 7/2006 | Lim | G02B 5/003 349/114 |
| 2006/0262242 | A1* | 11/2006 | Koma | G02F 1/1336 349/69 |
| 2009/0257001 | A1* | 10/2009 | Sumida | G02B 6/0033 349/65 |
| 2017/0299795 | A1 | 10/2017 | Shin et al. | |
| 2018/0157027 | A1* | 6/2018 | Kitahara | G02B 26/001 |
| 2018/0188591 | A1* | 7/2018 | Park | G02F 1/133504 |
| 2018/0205866 | A1* | 7/2018 | Komai | G03B 19/16 |
| 2019/0121174 | A1* | 4/2019 | Lee | G02F 1/1335 |

* cited by examiner

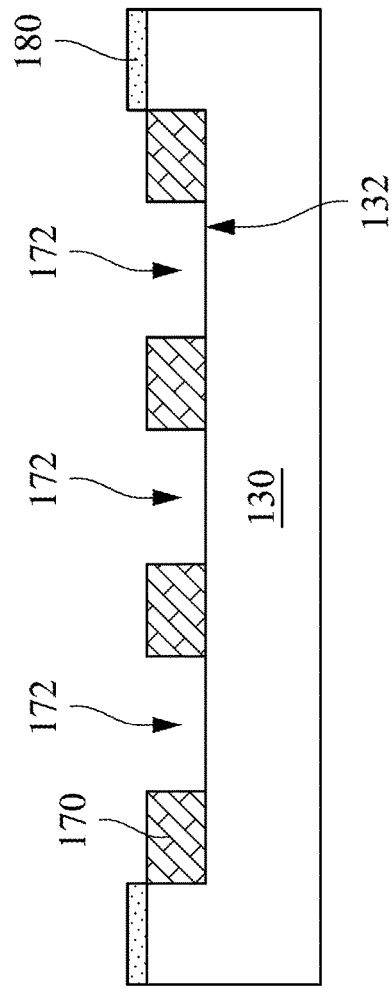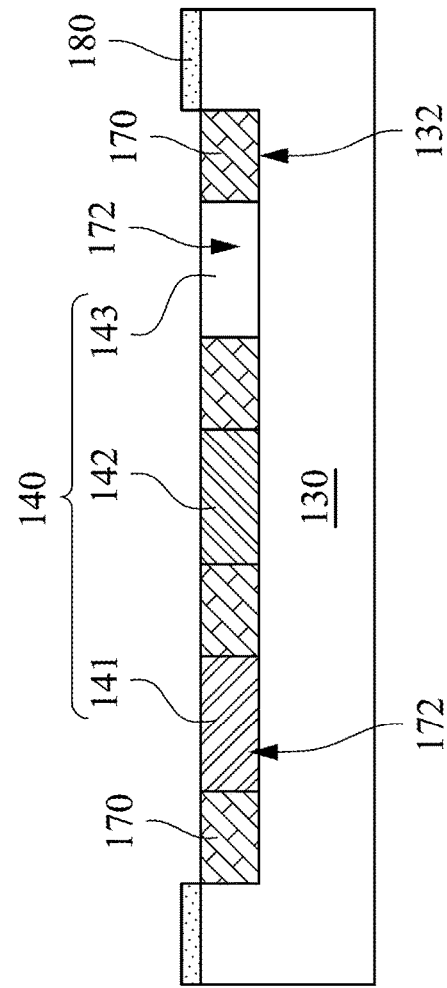

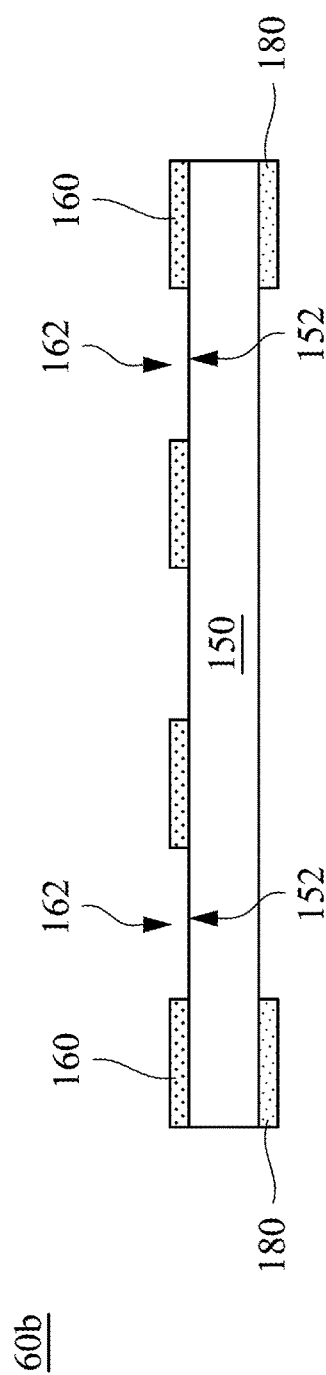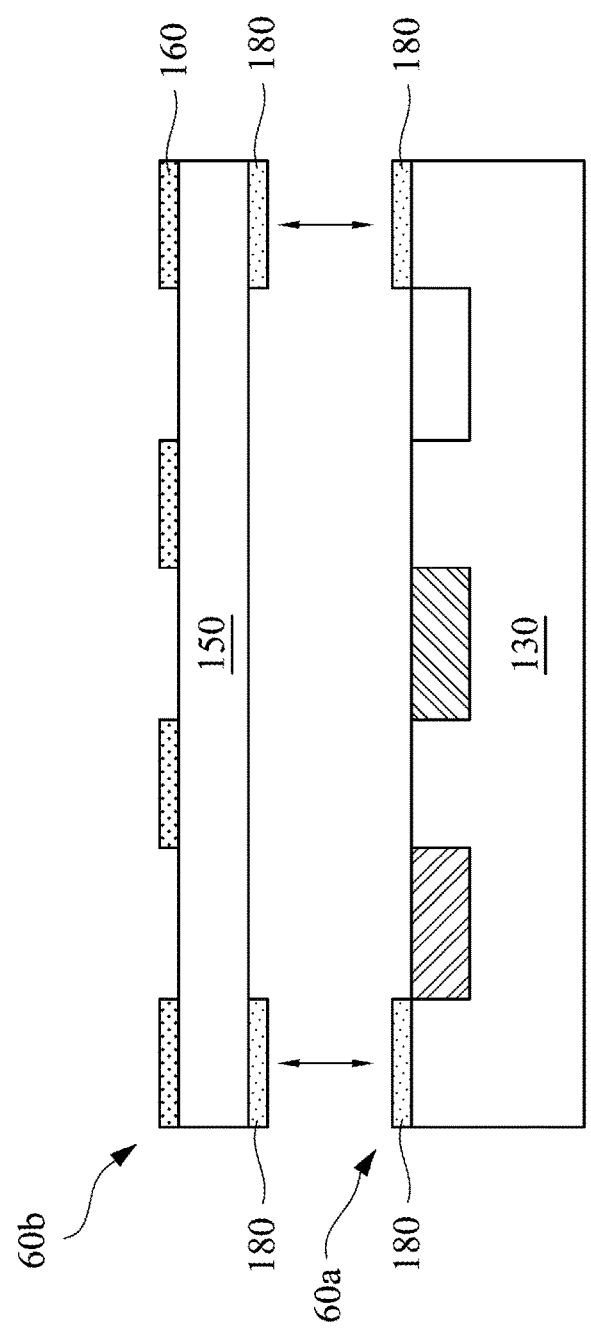

DISPLAY DEVICE HAVING MULTIPLE PIXELS IN A SUBSTRATE GROOVE

CROSS-REFERENCE TO RELATED APPLICATION

This application claims priority to Taiwan Application Serial Number 107214291, filed Oct. 22, 2018, which is herein incorporated by reference.

BACKGROUND

Field of Invention

The present invention relates to a display device.

Description of Related Art

The correctness of the color performance of a display device is closely related to the display quality, and the stability of a light source is one of the keys for determining whether the color can be correctly represented. However, in a display device containing a wavelength converting material, a protective layer is generally lacking, which causes moisture to easily permeate, thereby affecting the reliability of the wavelength converting material (such as phosphor or quantum dots).

SUMMARY

In view of this, an objective of the invention is to provide a display device that can solve the above problems.

In order to achieve the above objective, an aspect of the invention is to provide a display device. The display device includes a driving substrate, multiple light-emitting elements, a first transparent substrate, multiple pixels, a second transparent substrate, and a patterned light-absorbing layer. The multiple light-emitting elements are disposed on the driving substrate, and the light-emitting elements are configured to emit a light, where the light is a blue light or an ultraviolet light. The first transparent substrate is disposed over the driving substrate and the light-emitting elements. The first transparent substrate includes at least one groove. The multiple pixels are disposed in the groove. The pixels include a first sub-pixel, a second sub-pixel, and a third sub-pixel. The first, second, and third sub-pixels are respectively aligned with one of the light-emitting elements. The second transparent substrate covers the first transparent substrate and the pixels. The patterned light-absorbing layer is disposed on the second transparent substrate. The patterned light-absorbing layer includes multiple first openings to expose multiple light-transmissive regions on the second transparent substrate. The first openings are respectively aligned with the first, second, and third sub-pixels, where the first, second, and third sub-pixels correspond to the light emitted by the light-emitting elements to respectively generate a red light, a green light, and a blue light, and the red, the green and the blue lights emit through the respective light-transmissive regions.

According to an embodiment of the invention, the first sub-pixel is a red sub-pixel, the second sub-pixel is a green sub-pixel, and the third sub-pixel is a blue sub-pixel.

According to an embodiment of the invention, the red sub-pixel includes a red light conversion layer configured to convert a blue light or ultraviolet light into a red light. The green sub-pixel includes a green light conversion layer configured to convert a blue light or ultraviolet light into a green light. The red light conversion layer includes a red wavelength converting substance, and the green light conversion layer includes a green wavelength converting substance.

According to an embodiment of the invention, the blue sub-pixel includes a transparent layer configured to allow the blue light to penetrate. Alternatively, the blue sub-pixel includes a blue light conversion layer configured to convert the blue light or ultraviolet light into blue light, and the blue light conversion layer includes a blue wavelength converting substance.

According to an embodiment of the invention, the pixels further include a yellow sub-pixel that includes at least one yellow light conversion layer configured to convert an ultraviolet light into a yellow light. The yellow light conversion layer includes a yellow wavelength converting substance.

According to an embodiment of the invention, the pixels further include a white sub-pixel that includes at least one white light conversion layer configured to convert a blue light or ultraviolet light into a white light. The white light conversion layer includes red, green, and blue wavelength converting substances.

According to an embodiment of the invention, the at least one groove of the first transparent substrate is multiple grooves, and each pixel is located in a corresponding one of the grooves.

According to an embodiment of the invention, the display device further includes a patterned reflecting layer located in the groove. The patterned reflecting layer includes multiple second openings which correspond to the first openings. Each pixel is disposed in a corresponding one of the second openings.

According to an embodiment of the invention, the patterned reflecting layer includes a white resin.

According to an embodiment of the invention, the display device further includes a bonding layer sandwiched between the first transparent substrate and the second transparent substrate and the bonding layer surrounds the groove.

According to an embodiment of the invention, the groove has a depth of 10 to 110 micrometers.

According to an embodiment of the invention, the first transparent substrate has a thickness of 500 to 1,100 micrometers.

According to an embodiment of the invention, the light-emitting elements include a plurality of light-emitting diode chips, a plurality of micro light-emitting diode chips or a plurality of light-emitting diode packages.

According to an embodiment of the invention, the patterned light-absorbing layer is a black matrix.

According to an embodiment of the invention, the wavelength converting substances include phosphor or quantum dots or a combination thereof.

BRIEF DESCRIPTION OF THE DRAWINGS

The disclosure can be more fully understood by reading the following detailed description of the embodiment, with reference made to the accompanying drawings as follows:

FIGS. 5A to 5G are schematic cross-sectional views showing processes at various stages of a display device according to an embodiment of the invention.

FIGS. 6A to 6F are schematic cross-sectional views showing processes at various stages of a display device according to another embodiment of the invention.

DETAILED DESCRIPTION

Figure 1:
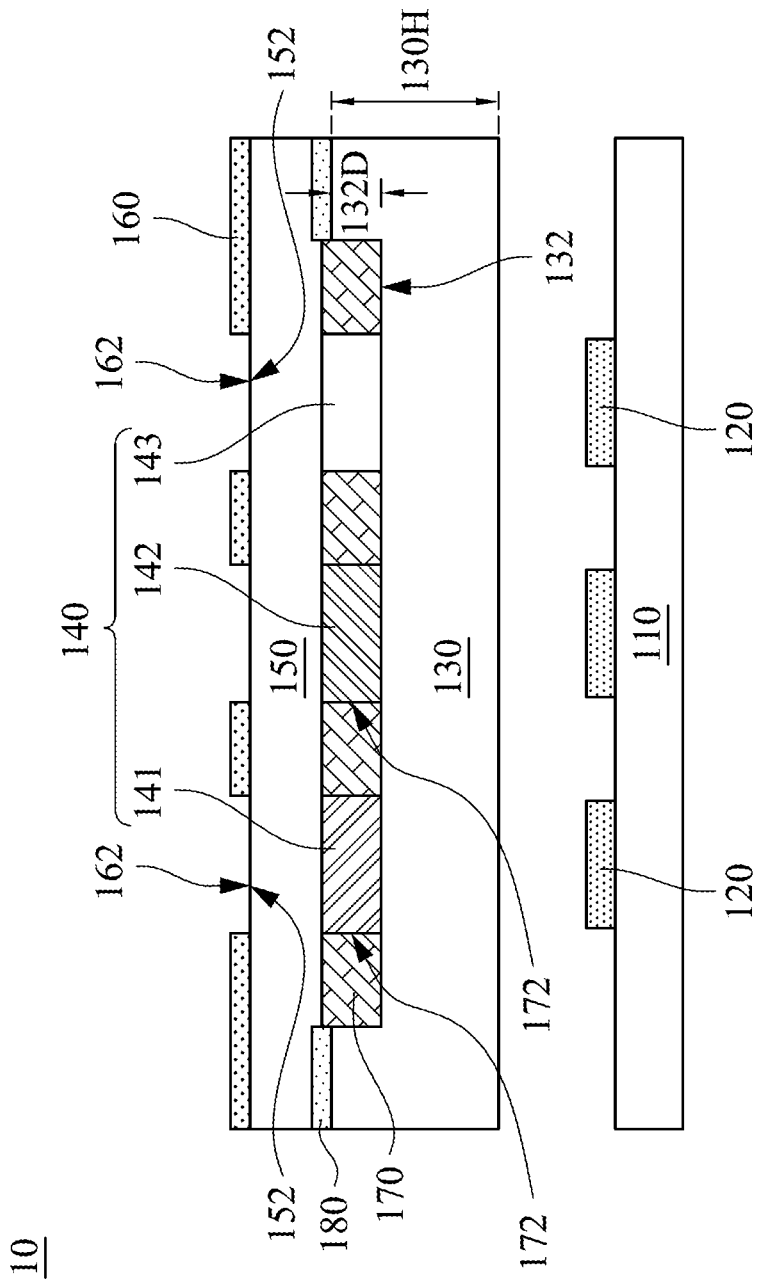
FIG. 1 is a cross-sectional schematic view of a display device according to an embodiment of the invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An aspect of the invention is to provide a display device. FIG. 1 is a cross-sectional schematic view of a display device 10 according to an embodiment of the invention. Please referring to FIG. 1, the display device 10 includes a driving substrate 110, multiple light-emitting elements 120, a first transparent substrate 130, multiple pixels 140, a second transparent substrate 150, and a patterned light-absorbing layer 160. In various embodiments, the driving substrate 110 may be a passive driving substrate or an active driving substrate. Specifically, the passive driving substrate does not have an active element such as a thin film transistor, and is driven by voltages inputted by corresponding transverse and longitudinal wires. The active driving substrate is driven by the active element thereon such as a thin film transistor.

As shown in FIG. 1, the multiple light-emitting elements 120 are disposed on the driving substrate 110, and the light-emitting elements 120 are configured to emit light. In various embodiments, the light-emitting elements 120 may include a plurality of light-emitting diode chips, a plurality of micro light-emitting diode chips, or a plurality of light-emitting diode packages. In various embodiments, the light emitted by the light-emitting elements 120 is a blue light or an ultraviolet light.

In general, if the LED chip of the light-emitting element 120 has a size of about 100 micrometers to 300 micrometers (for example, 150 micrometers), the LED chip may be referred to as sub-millimeter LED chip (mini LED chip). If the LED chip of the light-emitting element 120 has a size of less than 100 micrometers, the light-emitting diode chip may be referred to as micro LED chip.

Please continue to refer to FIG. 1. The first transparent substrate 130 is located over the driving substrate 110 and the light-emitting elements 120, and the first transparent substrate 130 includes at least one groove 132. In various embodiments, the first transparent substrate 130 may include glass, quartz, or other suitable transparent materials. In an embodiment, the first transparent substrate 130 has a thickness 130H of 500 to 1100 micrometers, and may be, for example, 600 micrometers, 700 micrometers, 800 micrometers, 910 micrometers, 930 micrometers, 950 micrometers, 970 micrometers, 990 micrometers, 1000 micrometers, 1010 micrometers, 1030 micrometers, 1050 micrometers, 1070 micrometers or 1090 micrometers. It should be noted that the groove 132 does not penetrate the first transparent substrate 130. Therefore, in an embodiment, the groove 132 has a depth 132D of 10 to 110 micrometers, and may be, for example, 10 micrometers, 20 micrometers, 30 micrometers, 40 micrometers, 50 micrometers, 60 micrometers, 70 micrometers, 80 micrometers, 90 micrometers, 100 micrometers, 101 micrometers, 103 micrometers, 105 micrometers, 107 micrometers or 109 micrometers. Although the first transparent substrate 130 illustrated in FIG. 1 is suspended over the driving substrate 110, practically, the first transparent substrate 130 may be fixed over the driving substrate 110 by a frame (not shown).

As shown in FIG. 1, the multiple pixels 140 are disposed in the groove 132. Specifically, the pixels 140 include a first sub-pixel 141, a second sub-pixel 142, and a third sub-pixel 143. It should be noted that the first sub-pixel 141, the second sub-pixel 142, and the third sub-pixel 143 are respectively aligned with one of the light-emitting elements 120. In an embodiment, the first sub-pixel 141 is a red sub-pixel including a red light conversion layer configured to convert blue light or ultraviolet light emitted by the light-emitting elements 120 into red light. In more detail, the red light conversion layer includes a red wavelength converting substance, and may further include red phosphor, red quantum dots (QDs), or a combination of the red phosphor and the red quantum dots. In an embodiment, the red light conversion layer further includes a light-transmissive resin mixed with the red wavelength converting substance. For example, the red phosphor is selected from a group consisting of manganese-doped red fluoride phosphor, $Y_2O_3$:Eu, CaS:Eu, Tm, $Y_2O_2S$:Eu, Mg, Ti, $Gd_2SO_2S$:Eu, Mg, Ti, (Sr,Ca)AlSiN$_3$:Eu and CaSrS:Eu. For example, the red quantum dots may include CdSe, and an all-inorganic perovskite quantum dot with a chemical formula CsPb$(Br_{1-b}I_b)_3$, where $0.5 \leq b \leq 1$. In an embodiment, the second sub-pixel 142 is a green sub-pixel including a green light conversion layer configured to convert blue light or ultraviolet light emitted by the light-emitting elements 120 into green light. In more detail, the green light conversion layer includes a green wavelength converting substance, and may further include green phosphor, green quantum dots (QDs), or a combination of the green phosphor and the green quantum dots. For example, the green phosphor may include β-SiAlON green phosphor, silicate green phosphor, and nitride series green phosphor. In an embodiment, the green light conversion layer further includes a light-transmissive resin mixed with the green wavelength converting substance. For example, the green quantum dots may include CdSe, CdS, CdTe, SInP, InN, AlInN, InGaN, AlGaInN, CuInGaSe, and an all-inorganic perovskite quantum dot with a chemical formula CsPb$(Br_{1-b}I_b)_3$, where $0 \leq b < 0.5$. It should be noted that in an embodiment, the third sub-pixel 143 is a blue sub-pixel including a transparent layer that can be penetrated by the blue light emitted by the light-emitting elements 120. In more detail, the transparent layer includes a light-transmissive resin, or the transparent layer is air. In an alternate embodiment, the third sub-pixel 143 includes a blue light conversion layer configured to convert blue light or ultraviolet light emitted by the light-emitting elements 120 into blue light. In more detail, the blue light conversion layer includes a blue wavelength converting substance, and may further include blue phosphor, blue quantum dots, or a combination of the blue phosphor and the blue quantum dots. For example, the blue phosphor is selected from a group consisting of $Sr_4Al_{14}O_{25}$:Eu, Dy, $CaAl_2O_4$:Eu, and Nd. For example, the blue quantum dots may include an all-inorganic perovskite quantum dot with a chemical formula $CsPb(Cl_aBr_{1-a})_3$, where $0<a\leq 1$. It can be understood that, since the different light-emitting elements 120 have different light-emitting angles, the first sub-pixel 141, the second sub-pixel 142, and the third sub-pixel 143 may each have a size greater than or substantially equal to the light-emitting elements 120. The "size" herein refers to the dimension of the length and the width of the element in the top view.

In another embodiment, the pixels 140 further include a yellow sub-pixel (not shown). In an embodiment, the yellow sub-pixel includes at least one yellow light conversion layer that can convert the blue light or ultraviolet light emitted by the light-emitting elements 120 into yellow light. In more detail, the yellow light conversion layer includes a yellow wavelength converting substance, and may further include yellow phosphor, yellow quantum dots, or a combination of the yellow phosphor and the yellow quantum dots. In an embodiment, the yellow light conversion layer further includes a light-transmissive resin mixed with the yellow wavelength converting substance. For example, the yellow phosphor may be aluminate yellow phosphor such as YAG phosphor ($Y_3Al_5O_{12}$:$Ce^{3+}$), may be silicate yellow phosphor such as $(Sr,Ba)_2SiO_4$:$Eu^{2+}$. In practice, the yellow sub-pixel can be matched with red, green, and blue sub-pixels.

In another embodiment, the pixels 140 further include a white sub-pixel (not shown). In an embodiment, the white sub-pixel includes at least one white light conversion layer that can convert the blue light or ultraviolet light emitted by the light-emitting elements 120 into white light. In more detail, the white light conversion layer includes red, green, and blue wavelength converting substances, and may be, for example, a mixture of the above red, green, and blue wavelength converting substances. In an embodiment, the white light conversion layer further includes a light-transmissive resin mixed with the red, green and blue wavelength converting substances. In practice, the white sub-pixel can be matched with red, green, and blue sub-pixels.

Please continue to refer to FIG. 1. The second transparent substrate 150 covers the first transparent substrate 130 and the pixels 140. In various embodiments, the second transparent substrate 150 may include glass, quartz, or other suitable transparent materials. The second transparent substrate 150 can block moisture to protect the pixels 140 from moisture interference, thereby improving the reliability and service life of products.

In some embodiments, as shown in FIG. 1, the display device 10 further includes a bonding layer 180 sandwiched between the first transparent substrate 130 and the second transparent substrate 150, and the bonding layer 180 surrounds the groove 132. In some embodiments, the bonding layer 180 may include a metal or a resin. For example, the metal includes indium (In), gold (Au), tin (Sn), and alloys of the above metals. For example, the resin includes polyimide, epoxy resin, ceramic, and diamond-like carbon. It can be understood that since the bonding layer 180 including the resin absorbs moisture in the atmosphere more easily than the bonding layer 180 including the metal, the display device 10 is aged faster. Therefore, it is preferable to use the metal-containing bonding layer 180.

Please continue to refer to FIG. 1. The patterned light-absorbing layer 160 is disposed on the second transparent substrate 150. Specifically, the patterned light-absorbing layer 160 is a black matrix (BM), and includes multiple first openings 162 to expose multiple light-transmissive regions 152 on the second transparent substrate 150, and the positions of the first openings 162 are respectively aligned with the first sub-pixel 141, the second sub-pixel 142, and the third sub-pixel 143. The first sub-pixel 141, the second sub-pixel 142, and the third sub-pixel 143 respectively generate red, green, and blue light, and the lights emit through the corresponding light-transmissive regions 152 and the first openings 162. That is, the blue light or ultraviolet light emitted by the light-emitting elements 120 can be subjected to wavelength conversion by the corresponding first sub-pixel 141, second sub-pixel 142, and third sub-pixel 143, thereby penetrating the second transparent substrate 150 to emit the red, green and blue light. Since the second transparent substrate 150 has the patterned light-absorbing layer 160 thereon, the display contrast can be improved in addition to the avoidance of light mixing between the red, green, and blue light.

In various embodiments, as shown in FIG. 1, the display device 10 further includes a patterned reflecting layer 170 located in the groove 132. The patterned reflecting layer 170 includes multiple second openings 172 corresponding to the aforementioned first openings 162, and each pixel 140 is disposed in a corresponding one of the second openings 172. Through the patterned reflecting layer 170 disposed around the sides of the respective pixels 140, lateral light converted by each pixel 140 can be reflected by the patterned reflecting layer 170, thereby improving the light extraction efficiency of the display device 10. In some embodiments, the patterned reflecting layer 170 is formed by a white resin that has light reflecting properties and does not leak light. For example, the white resin includes poly(methyl methacrylate) (PMMA), polyethylene terephthalate (PET), polystyrene (PS), polyethylene (PP), polyamide (PA), polycarbonate (PC), epoxy resin, silicon, etc. In another embodiment, the patterned reflecting layer 170 may include a metal such as silver, aluminum, rhodium, a silver alloy, and combinations thereof.

Figure 2:
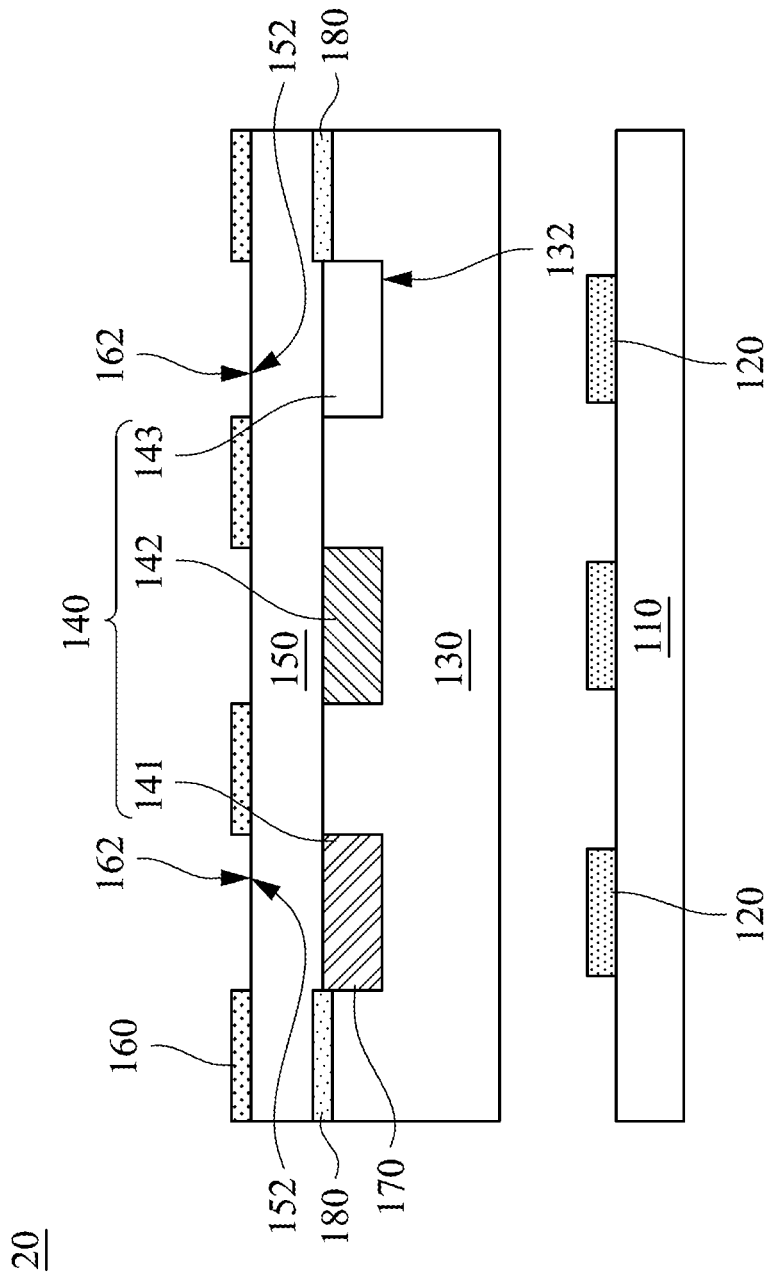
FIG. 2 is a cross-sectional schematic view of a display device according to another embodiment of the invention.
Figure 3:
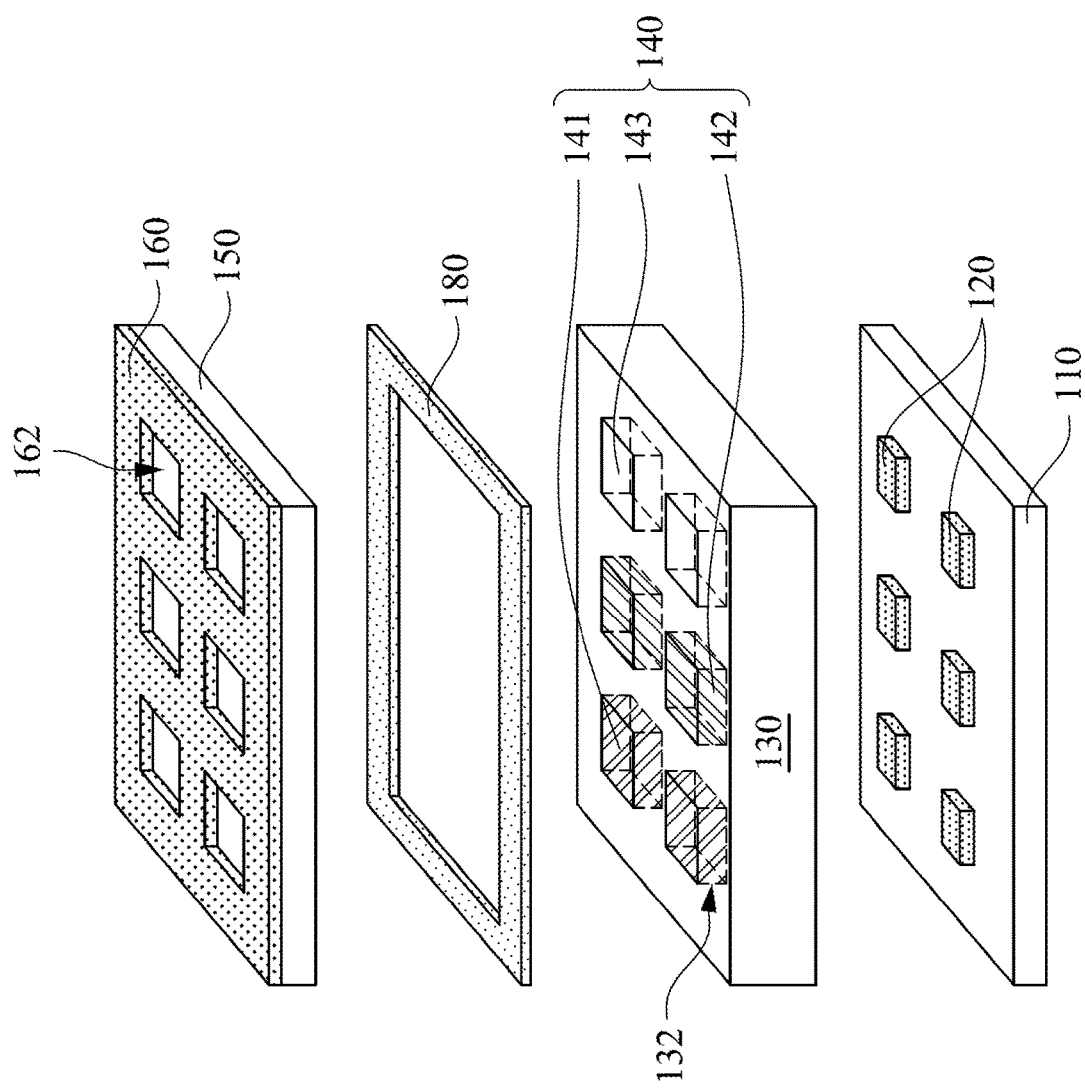
FIG. 3 is a schematic exploded perspective view of the embodiment of FIG. 2.

FIG. 2 is a cross-sectional schematic view of a display device 20 according to another embodiment of the invention. FIG. 3 is a schematic exploded perspective view of the embodiment of FIG. 2. The display device 20 shown in FIGS. 2 and 3 is different from the display device 10 shown in FIG. 1 in that the first transparent substrate 130 of the display device 20 includes multiple grooves 132, and each pixel 140 is located in a corresponding one of the grooves 132. It should be noted that this embodiment does not include the patterned reflecting layer 170 as shown in FIG. 1. Please refer to FIGS. 2 and 3 simultaneously. In this embodiment, any two adjacent grooves 132 are spaced apart by a certain distance to avoid light mixing between red, green and blue light. It can be understood that this distance can be adjusted according to the sizes and the light-emitting angle of the light-emitting elements 120.

Figure 4:
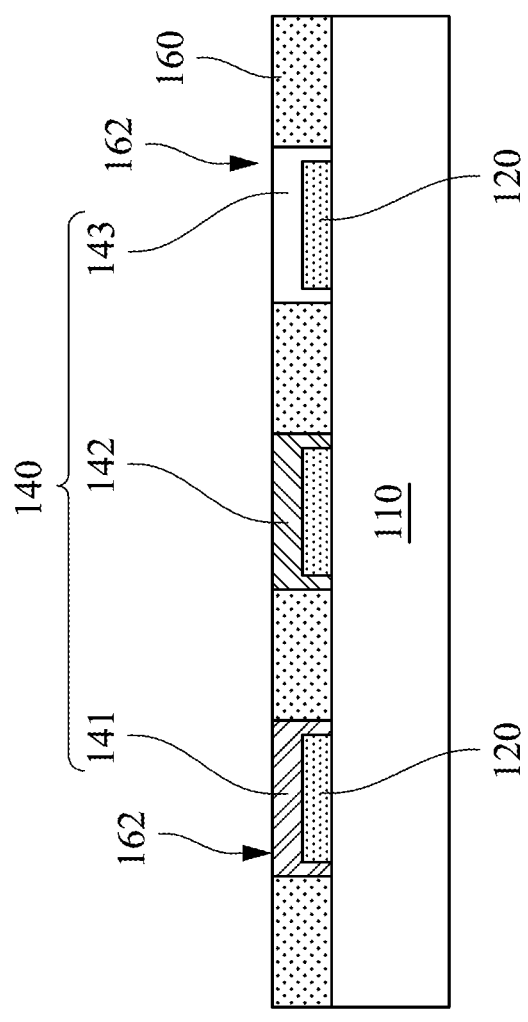
FIG. 4 is a cross-sectional schematic view of a display device according to a comparative example.

FIG. 4 is a cross-sectional schematic view of a display device 40 according to a comparative example of the invention. The display device 40 shown in FIG. 4 is different from the display device 10 shown in FIG. 1 in that the patterned light-absorbing layer 160 of the display device 40 is disposed on the driving substrate 110, and the multiple light-emitting elements 120 disposed on the driving substrate 110 are exposed by the multiple first openings 162 of the patterned light-absorbing layer 160. The first sub-pixel 141, the second sub-pixel 142, and the third sub-pixel 143 each are respectively located in a corresponding one of the first openings 162, and cover the light-emitting elements 120. In this comparative example, the first sub-pixel 141, the second sub-pixel 142, and the third sub-pixel 143 are directly exposed to the atmosphere without the additional protection of a protective layer, which easily affects the reliability of the pixels 140. In addition, the patterned light-absorbing layer 160 in this comparative example absorbs most of the lateral light, thereby reducing the luminous efficiency of the light-emitting element 120.

Another aspect of the invention is to provide a method for manufacturing a display device. FIGS. 5A to 5G are schematic cross-sectional views showing processes at various stages of a display device 10 according to an embodiment of the invention.

Figure 5A:
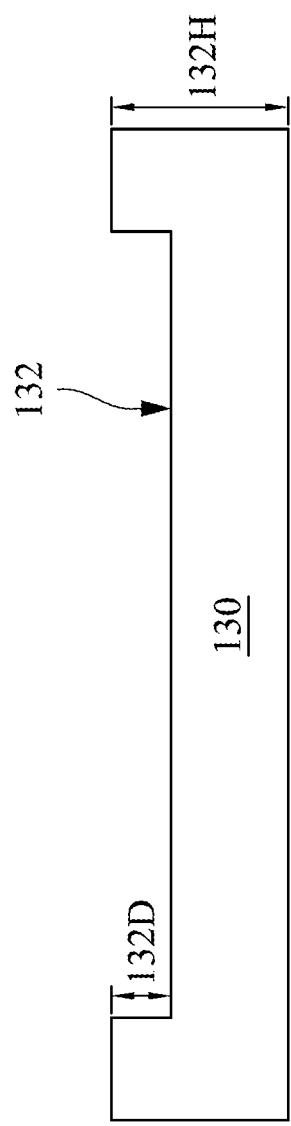

First, a first transparent substrate 130 is provided, as shown in FIG. 5A. Specifically, the first transparent substrate 130 includes grooves 132. In an embodiment, the first transparent substrate 130 has a thickness 130H of 500 to 1100 micrometers, and may be, for example, 600 micrometers, 700 micrometers, 800 micrometers, 900 micrometers, 910 micrometers, 930 micrometers, 950 micrometers, 970 micrometers, 990 micrometers, 1000 micrometers, 1010 micrometers, 1030 micrometers, 1050 micrometers, 1070 micrometers or 1090 micrometers. It should be noted that the groove 132 does not penetrate the first transparent substrate 130. Therefore, in an embodiment, the groove 132 has a depth of 10 to 110 micrometers, and may be, for example, 10 micrometers, 20 micrometers, 30 micrometers, 40 micrometers, 50 micrometers, 60 micrometers, 70 micrometers, 80 micrometers, 90 micrometers, 100 micrometers, 101 micrometers, 103 micrometers, 105 micrometers, 107 micrometers or 109 micrometers. In various embodiments, the groove 132 can be formed by dry etching, wet etching, reactive ion etching (RIE), and/or other suitable processes.

Figure 5B:
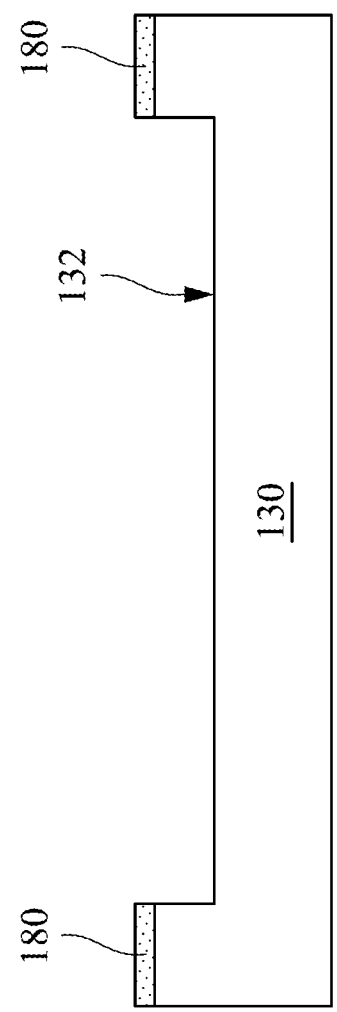

Then, a bonding layer 180 is formed on the first transparent substrate 130 and surrounds the grooves 132, as shown in FIG. 5B. In some embodiments, the bonding layer 180 may include a metal or a resin. For example, the metal includes indium (In), gold (Au), or tin (Sn). For example, the resin includes polyimide, epoxy resin, ceramic, and diamond-like carbon. In some embodiments, a bonding layer 180 including a metal can be formed by evaporation. In some embodiments, a bonding layer 180 including a resin can be formed by coating. It can be understood that since the bonding layer 180 including the resin absorbs moisture in the atmosphere more easily than the bonding layer 180 including the metal, the display device 10 is aged faster. Therefore, it is preferable to use the metal-containing bonding layer 180.

Next, a patterned reflecting layer 170 is formed in the groove 132 as shown in FIG. 5C. More specifically, the patterned reflecting layer 170 includes multiple second openings 172. In some embodiments, the patterned reflecting layer 170 is formed by a white resin that has light reflecting properties and does not leak light. For example, the white resin includes poly(methyl methacrylate) (PMMA), polyethylene terephthalate (PET), polystyrene (PS), polyethylene (PP), polyamide (PA), polycarbonate (PC), epoxy resin, silica gel resin, etc. In another embodiment, the patterned reflecting layer 170 may include a metal such as silver, aluminum, rhodium, a silver alloy, and combinations thereof. In various embodiments, the patterned reflecting layer 170 can be formed by a photolithographic etching process.

Then, multiple pixels 140 are filled into corresponding ones of the second openings 172 to form a wavelength conversion structure 50a as shown in FIG. 5D. In more detail, the pixels 140 may include a first sub-pixel 141 (red sub-pixel), a second sub-pixel 142 (green sub-pixel), and a third sub-pixel 143 (blue sub-pixel). In other embodiments, the pixels 140 may further include a yellow sub-pixel (not shown) and/or a white sub-pixel (not shown). The details of the first sub-pixel 141, the second sub-pixel 142, the third sub-pixel 143, the yellow sub-pixel, and the white sub-pixel can be refer to the foregoing description, and details are not described hereafter. It should be noted that the pixels 140 must be filled into the second openings 172 after the formation of the bonding layer 180. The reason for this is that when the evaporation process is performed, the first transparent substrate 130 is exposed to a high temperature environment, and if the pixels 140 are filled first and then the bonding layer 180 is formed, the pixels 140 are prone to structural deterioration at a high temperature.

Figure 5E:
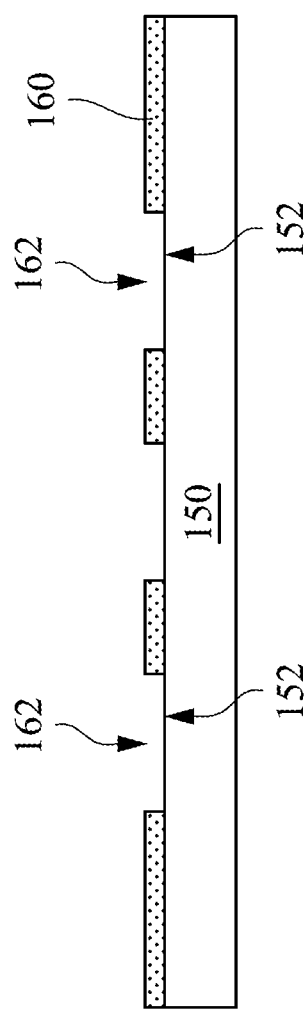

A patterned light-absorbing layer 160 is formed on a second transparent substrate 150, as shown in FIG. 5E. In more detail, the patterned light-absorbing layer 160 includes multiple first openings 162, and a portion of the second transparent substrate 150 is exposed by the first openings 162 to form multiple light-transmissive regions 152 correspondingly. In some embodiments, the patterned light-absorbing layer 160 is a black matrix (BM). In various embodiments, the patterned light-absorbing layer 160 can be formed by a photolithographic etching process.

Figure 5F:
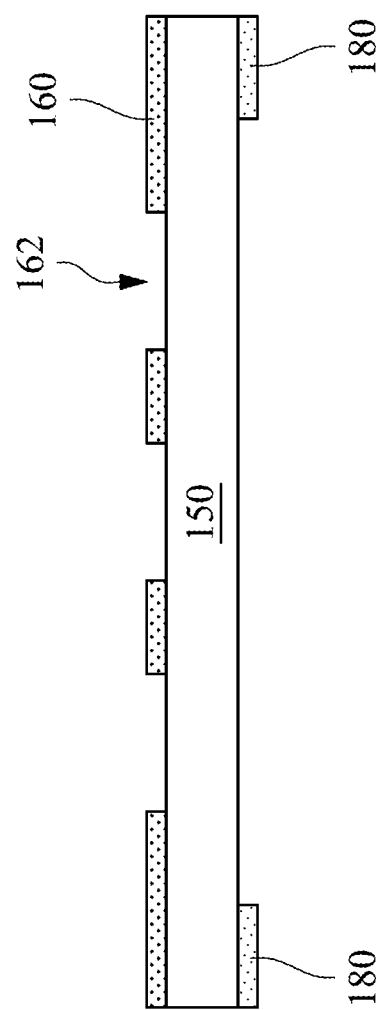

Then, a bonding layer 180 is formed on the second transparent substrate 150 opposite to the patterned light-absorbing layer 160 to form an upper cover protective structure 50b, as shown in FIG. 5F. That is, the bonding layer 180 and the patterned light-absorbing layer 160 are formed on two opposite surfaces of the second transparent substrate 150. The bonding layer 180 in this step is the same as or similar to the bonding layer 180 in FIG. 5B, and therefore will not be described again.

Figure 5G:
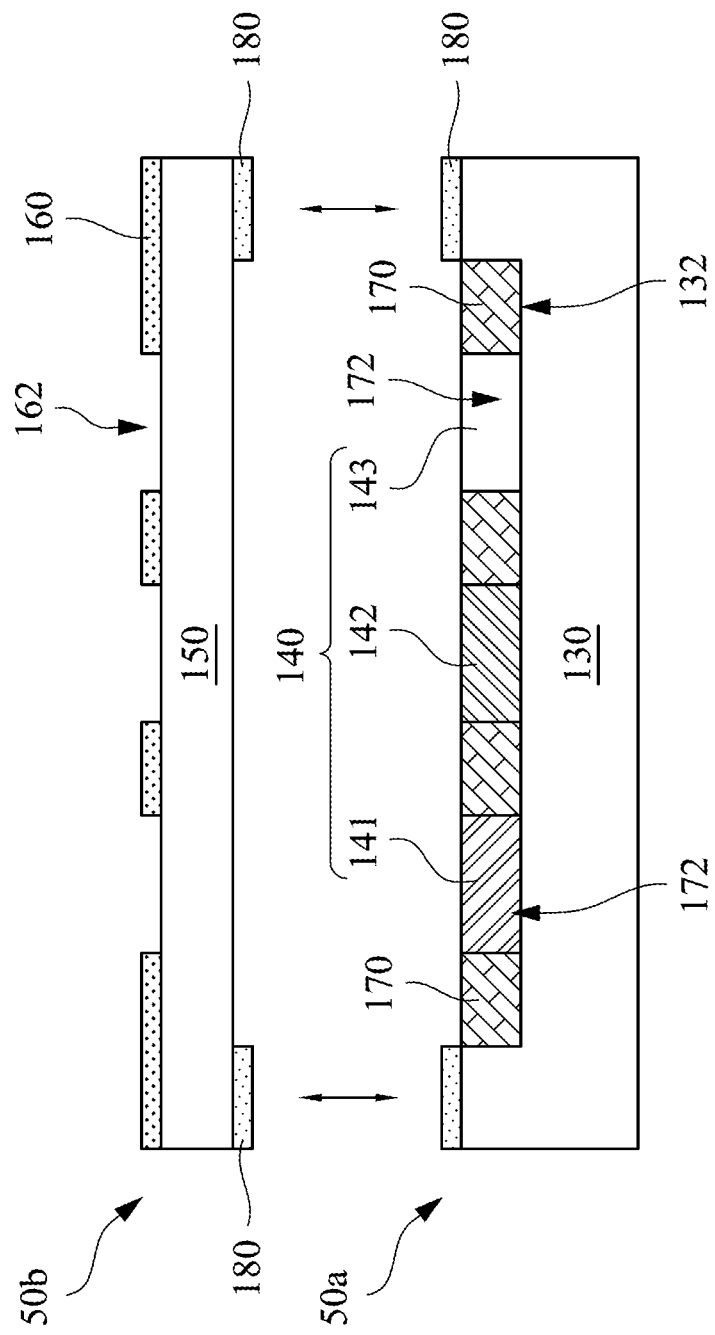

Next, as shown in FIG. 5G, the bonding layer 180 of the upper cover protective structure 50b as shown in FIG. 5F is bonded to the bonding layer 180 of the wavelength conversion structure 50a as shown in FIG. 5D. In a preferred embodiment, when the bonding layers 180 of the above two structures include a metal, the wavelength conversion structure 50a and the upper cover protective structure 50b may be bonded to each other using a eutectic method. Since the eutectic method can usually be performed in a lower temperature environment, the pixels 140 can be protected from high temperature. After being bonded, the wavelength conversion structure 50a and the upper cover protective structure 50b are placed over the driving substrate 110 having the multiple light-emitting elements 120, and thus the display device 10 as shown in FIG. 1 can be obtained. For a detailed description of the display device 10, please refer to the related description of FIG. 1 above, and details are not described herein again.

Figure 6A:
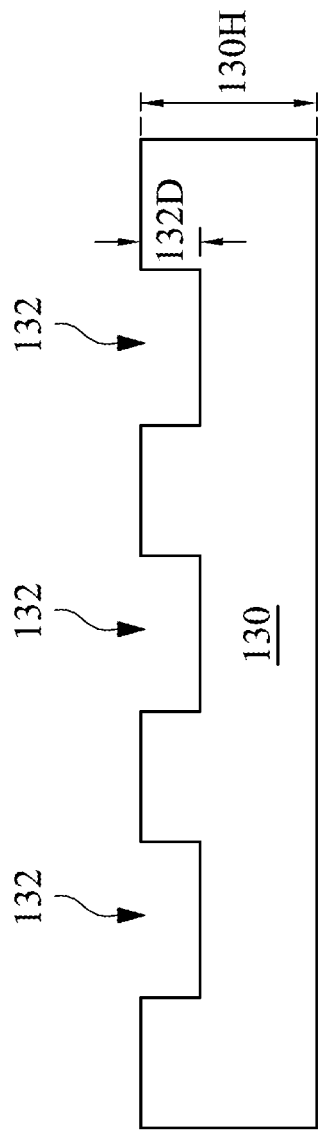

FIGS. 6A to 6F are schematic cross-sectional views showing processes at various stages of a display device 20 according to another embodiment of the invention. First, a first transparent substrate 130 is provided, as shown in FIG. 6A. Specifically, the first transparent substrate 130 includes multiple grooves 132. For the detailed manufacturing process and features of the first transparent substrate 130 and the grooves 132, refer to the related description of the foregoing FIG. 5A, and details are not described herein again.

Figure 6B:
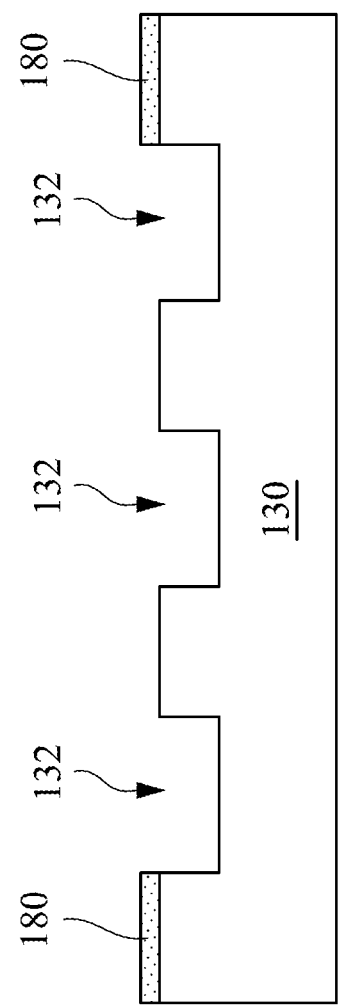

Then, a bonding layer 180 is formed on the first transparent substrate 130 and surrounds the grooves 132, as shown in FIG. 6B. In more detail, the bonding layer 180 is formed around the first transparent substrate 130, and not formed around each groove 132. For the detailed manufacturing process and features of the bonding layer 180, refer to the related description of the foregoing FIG. 5B, and details are not described herein again.

Figure 6C:
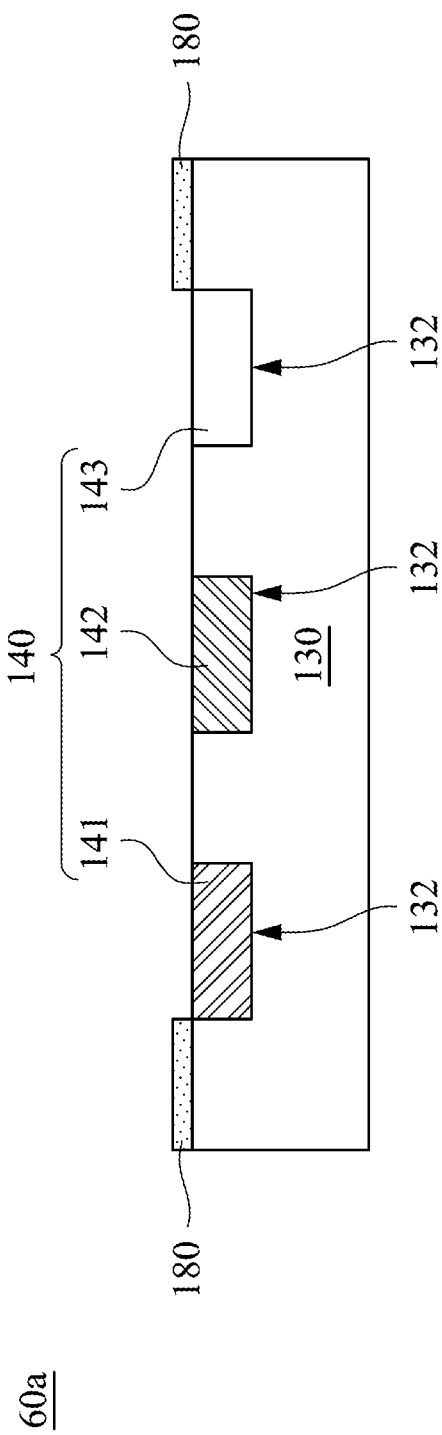

Next, multiple pixels 140 are filled into corresponding ones of the grooves 132 to form a wavelength conversion structure 60a as shown in FIG. 6C. Please refer to the foregoing for a detailed introduction of the pixel 140, and details will not be repeated here again.

Figure 6D:
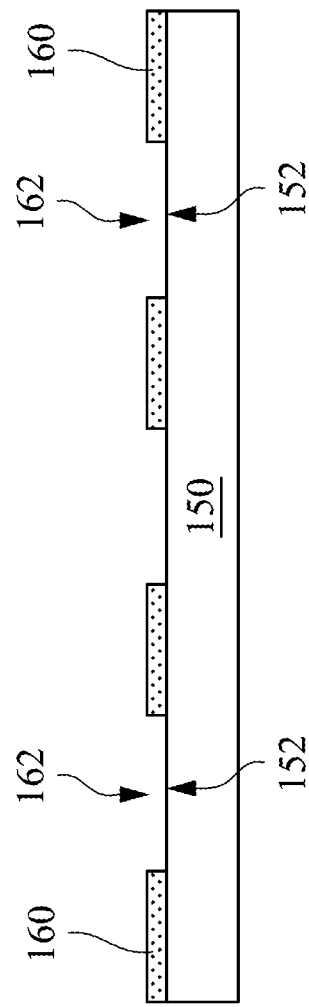

A patterned light-absorbing layer 160 is formed on a second transparent substrate 150, as shown in FIG. 6D. In more detail, the patterned light-absorbing layer 160 includes multiple first openings 162, and a portion of the second transparent substrate 150 is exposed by the first openings 162 to form multiple light-transmissive regions 152 correspondingly. For the detailed manufacturing process and features of the patterned light-absorbing layer 160, refer to the related description of the foregoing FIG. 5E, and details are not described herein again.

Then, a bonding layer 180 is formed on the second transparent substrate 150 opposite to the patterned light-absorbing layer 160 to form an upper cover protective structure 60b, as shown in FIG. 6E. That is, the bonding layer 180 and the patterned light-absorbing layer 160 are formed on two opposite surfaces of the second transparent substrate 150. For the detailed manufacturing process of this step, refer to the related description of the foregoing FIG. 5F, and details are not described herein again.

Next, as shown in FIG. 6F, the bonding layer 180 of the upper cover protective structure 60b as shown in FIG. 6E is bonded to the bonding layer 180 of the wavelength conversion structure 60a as shown in FIG. 6C. For the detailed manufacturing process of this step, refer to the related description of the foregoing FIG. 5G, and details are not described herein again. After being bonded, the wavelength conversion structure 60a and the upper cover protective structure 60b are placed over the driving substrate 110 having the multiple light-emitting elements 120, and thus the display device 20 as shown in FIG. 2 and FIG. 3 can be obtained. For a detailed description of the display device 20, please refer to the related description of FIG. 2 and FIG. 3 above, and details are not described herein again.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
a driving substrate;
multiple light-emitting elements disposed on the driving substrate, wherein the light-emitting elements are configured to emit a light, wherein the light is a blue light or an ultraviolet light;
a first transparent substrate disposed over the driving substrate and the light-emitting elements, wherein the first transparent substrate comprises at least one groove;
multiple pixels disposed in the groove, wherein the pixels comprise a first sub-pixel, a second sub-pixel, and a third sub-pixel, and the first sub-pixel, the second sub-pixel, and the third sub-pixel are respectively aligned with one of the light-emitting elements;
a second transparent substrate which covers the first transparent substrate and the pixels; and
a patterned light-absorbing layer disposed on the second transparent substrate, wherein the patterned light-absorbing layer comprises multiple first openings to expose multiple light-transmissive regions on the second transparent substrate, the first openings are respectively aligned with the first, second, and third sub-pixels, wherein the first, second, and third sub-pixels correspond to the light emitted by the light-emitting elements to respectively generate a red light, a green light, and a blue light, and the red, the green and the blue lights emit through the respective light-transmissive regions.

2. The display device of claim 1, wherein the first sub-pixel is a red sub-pixel, the second sub-pixel is a green sub-pixel, and the third sub-pixel is a blue sub-pixel.

3. The display device of claim 2, wherein the red sub-pixel comprises a red light conversion layer configured to convert the blue light or the ultraviolet light into the red light, the green sub-pixel comprises a green light conversion layer configured to convert the blue light or the ultraviolet light into the green light, wherein the red light conversion layer comprises a red wavelength converting substance, and the green light converting layer comprises a green wavelength converting substance.

4. The display device of claim 3, wherein the red wavelength converting substance and the green wavelength converting substance comprise phosphor or quantum dots or a combination thereof.

5. The display device of claim 2, wherein the blue sub-pixel is a transparent layer configured to allow the blue light to penetrate, or the blue sub-pixel comprises a blue light conversion layer configured to convert the blue light or the ultraviolet light into the blue light, wherein the blue light conversion layer comprises a blue wavelength converting substance.

6. The display device of claim 2, wherein the pixels further comprise a yellow sub-pixel, wherein the yellow sub-pixel comprises at least one yellow light conversion layer configured to convert the blue light or the ultraviolet light into a yellow light, and the yellow light conversion layer comprises a yellow wavelength converting substance.

7. The display device of claim 6, wherein the yellow wavelength converting substance comprises phosphor or quantum dots or a combination thereof.

8. The display device of claim 2, wherein the pixels further comprise a white sub-pixel, wherein the white sub-pixel comprises at least one white light conversion layer configured to convert the blue light or the ultraviolet light into a white light, and the white light conversion layer comprises a red wavelength converting substance, a green wavelength converting substance and a blue wavelength converting substance.

9. The display device of claim 8, wherein the red, the green, and the blue wavelength converting substances comprise phosphor or quantum dots or a combination thereof.

10. The display device of claim 1, wherein the at least one groove of the first transparent substrate is multiple grooves, and each pixel is located in a corresponding one of the grooves.

11. The display device of claim 1, further comprising a patterned reflecting layer located in the groove, wherein the patterned reflecting layer comprises multiple second openings corresponding to the first openings, and each of the pixels is disposed in a corresponding one of the second openings.

12. The display device of claim 11, wherein the patterned reflecting layer comprises a white resin.

13. The display device of claim 1, further comprising a bonding layer sandwiched between the first transparent substrate and the second transparent substrate, and the bonding layer surrounds the groove.

14. The display device of claim 1, wherein the groove has a depth of 10 to 110 micrometers.

15. The display device of claim 1, wherein the first transparent substrate has a thickness of 500 to 1,100 micrometers.

16. The display device of claim 1, wherein the light-emitting elements comprise a plurality of light-emitting diode chips, a plurality of micro light-emitting diode chips or a plurality of light-emitting diode packages.

17. The display device of claim 1, wherein the patterned light-absorbing layer is a black matrix.

* * * * *